United States Patent [19]
Okayasu et al.

[11] Patent Number: 5,973,542
[45] Date of Patent: Oct. 26, 1999

[54] DRIVER CIRCUIT WITH TEMPERATURE CORRECTION CIRCUIT

[75] Inventors: Toshiyuki Okayasu; Satoshi Iwamoto, both of Tokyo, Japan

[73] Assignee: Advantest Corp., Tokyo, Japan

[21] Appl. No.: 08/913,350

[22] PCT Filed: Jan. 20, 1997

[86] PCT No.: PCT/JP97/00103

§ 371 Date: Feb. 9, 1998

§ 102(e) Date: Feb. 9, 1998

[87] PCT Pub. No.: WO97/33370

PCT Pub. Date: Sep. 12, 1997

[30] Foreign Application Priority Data

Mar. 6, 1996 [JP] Japan .................................... 8-078228

[51] Int. Cl.[6] .................................................. H03K 17/14
[52] U.S. Cl. .......................... 327/378; 327/513; 327/541
[58] Field of Search .................................. 327/379, 389, 327/391, 436, 437, 513, 378, 538, 540, 541, 512; 326/32

[56] References Cited

U.S. PATENT DOCUMENTS

| | | | |
|---|---|---|---|
| 4,975,598 | 12/1990 | Borkar | 307/443 |
| 5,376,846 | 12/1994 | Houston | 327/513 |

Primary Examiner—Kenneth B. Wells
Assistant Examiner—Minh Nguyen
Attorney, Agent, or Firm—Muramatsu & Associates

[57] ABSTRACT

A driver circuit having a temperature correction circuit for providing a relatively stable output amplitude and timing by detecting electric consumption of an output stage of the driver circuit and correcting the changes in the amplitude and timing of an output signal therefrom. The temperature correction circuit includes a temperature detection part for detecting temperature change in a pair of output elements, an output timing temperature correction part for correcting the output timing of the output signal relative to an input signal upon receiving the temperature detection signal from the temperature detection part, and an output amplitude and impedance temperature correction part for correcting output amplitudes and output impedance of the output signal.

7 Claims, 6 Drawing Sheets

DRIVER CIRCUIT WITH TEMPERATURE CORRECTION CIRCUIT

FIELD OF THE INVENTION

This invention relates to a temperature correction circuit for a driver circuit which outputs pulse signals to be used for electric instruments, and more particularly, to a temperature correction circuit used in a driver circuit which is capable of generating a signal output having a stable, predetermined amplitude and timing despite temperature changes in the driver circuit.

BACKGROUND OF THE INVENTION

Figure 4:
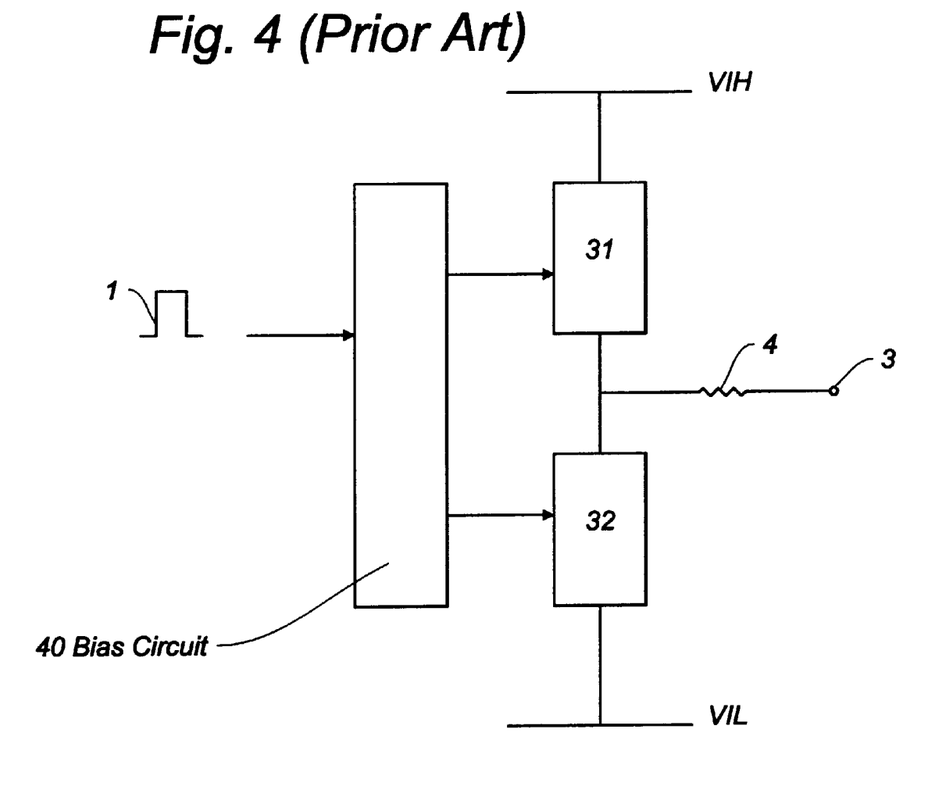
FIG. 4 is a block diagram showing a driver circuit without temperature correction circuit in the conventional technology.
Figure 5:
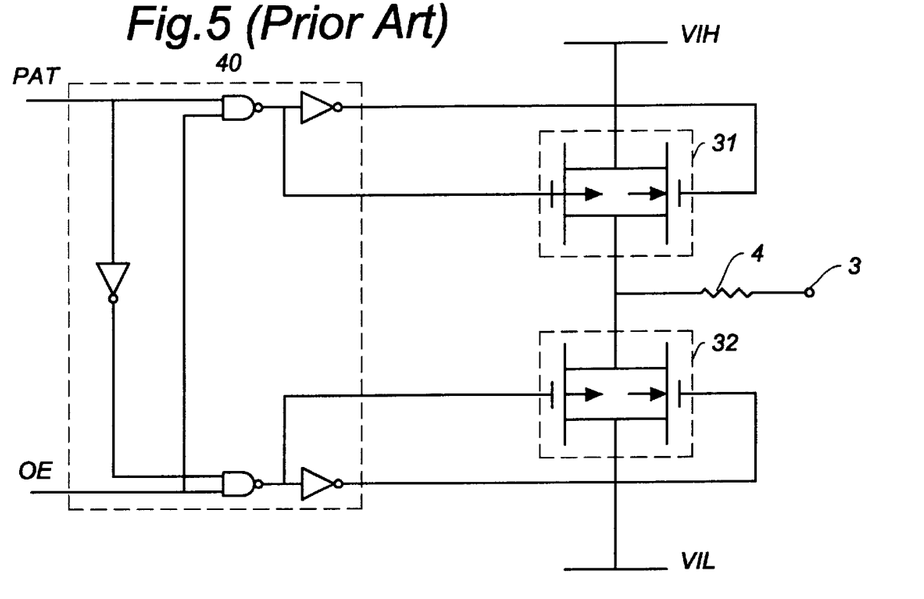
FIG. 5 is a circuit diagram showing a specific example of driver circuit without temperature correction circuit in the conventional technology.

FIG. 4 shows a block diagram of the last stage of a driver circuit with a complementary configuration in the conventional technology. The last stage of the driver is comprised of a bias circuit 40, output elements 31 and 32, and an output resistor 4 for output impedance matching. FIG. 5 shows a basic structure of a pin driver circuit corresponding to one test channel of an IC test system for driving a device pin of a semiconductor device under test (DUT). The example of FIG. 5 is a driver circuit without a temperature correction circuit.

The output elements 31 and 32 in this example are formed with CMOS transfer gates.

The output elements 31 and 32 in the last stage of the driver circuit change the amount of electric consumption according to the pulse waveforms and operating speeds. As a consequence, the junction temperature of the output elements also changes, which fluctuates the output characteristics of the driver circuit. Consequently, the output amplitudes and output timings vary from what originally intended.

Figure 6:
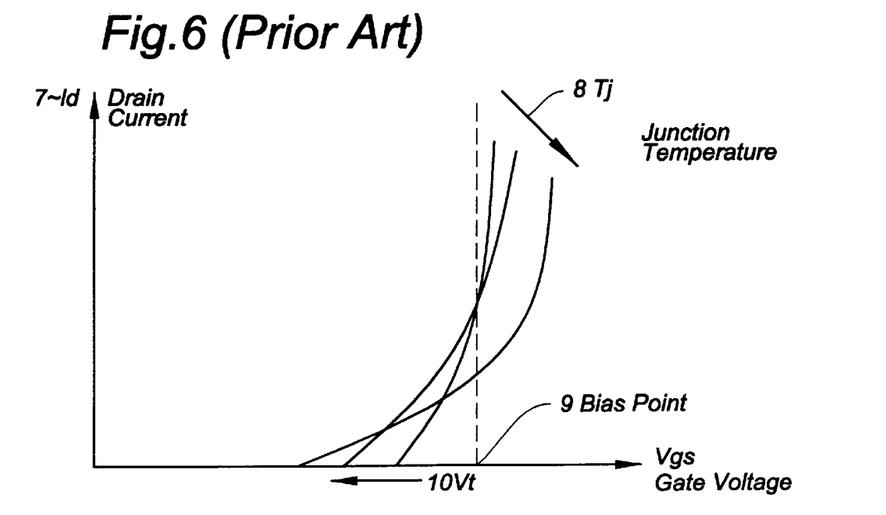
FIG. 6 is a diagram showing an example of drain-current versus gate voltage characteristic of an output element of the driver circuit when the temperature of the output element rises.
Figure 7A:
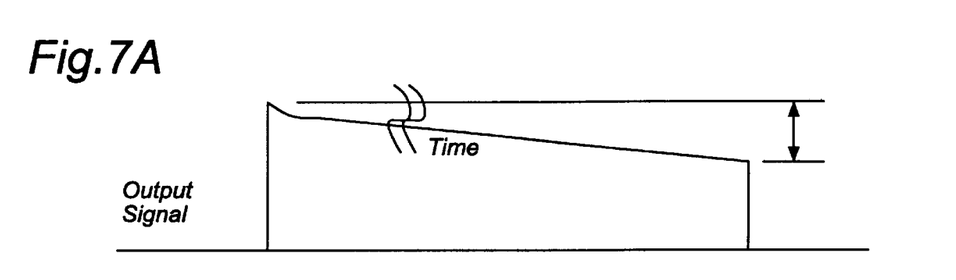
FIG. 7(a) is a diagram showing the changes in the output level as a function of time when the temperature increases.

FIG. 6 shows an example of drain current with respect to gate voltage in the output element when the temperature increases. In general, when the temperature in the MOSFET devices rises, the threshold voltage shown as Vt and drain current shown as Id will decrease. As a result, the drain current Id of the bias point 9 decreases from the original value. Because of this characteristics, there is a problem in the conventional driver circuit that the output level drops with an elapse of time as shown in an output signal 3 of FIG. 7(a).

However, when load resistance or the like is connected to the output or no load is connected, there is no deviation in the output level. Nevertheless, a switch timing and output impedance fluctuates.

The present invention is to maintain the output impedance of the driver circuit constant.

Figure 7B:
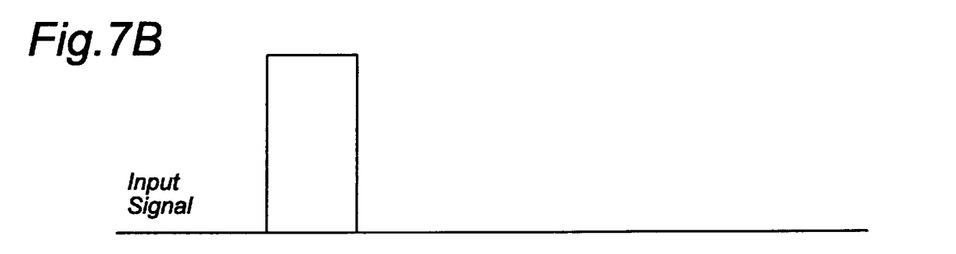
FIGS. 7(b)–(d) are diagrams showing the changes in the timings of the output signal when the temperature increases.
Figure 7C:
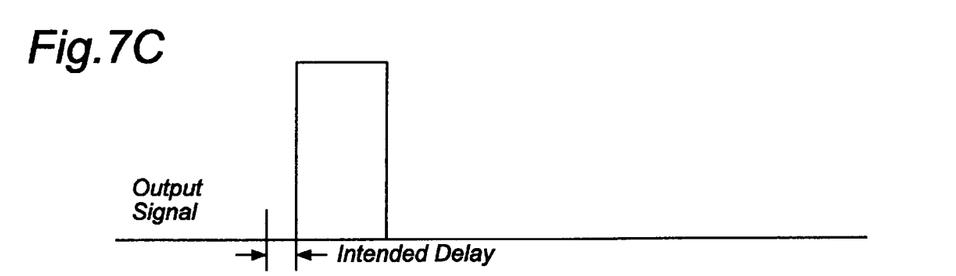
Figure 7D:
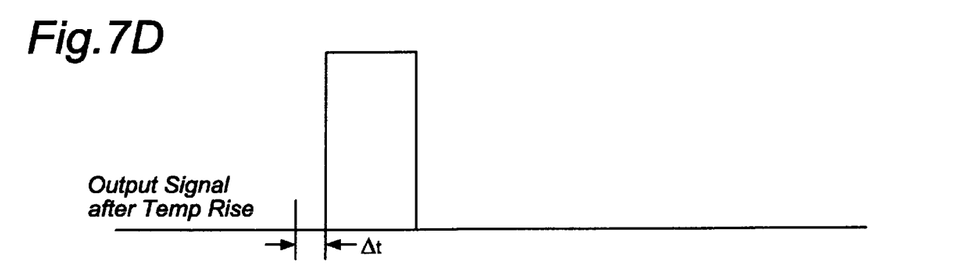

FIGS. 7(b)–7(d) show an example of timing deviations arise in an output signal 3. Namely, in the conventional technology, the intended delay timing 11 shown in FIG. 7(c) is changed to Δt as shown in FIG. 7(d). In this manner, the timing deviation is occurred by the temperature change in the driver circuit.

Further, for a driver circuit that requires a high degree of precision, an external apparatus must be installed to keep the temperature surrounding the driver circuit constant by a forceful cooler or an air conditioner, resulting in inconvenience in the application of the driver circuit.

As explained in the foregoing, in the driver circuit without a temperature compensation capability, the output amplitudes and output timings deviate from the originally intended ones because of the change in the heat dissipation accompanied by the change of power consumption in the output elements 31 and 32 in the driver circuit. Consequently, the driver circuit in the conventional technology is not able to provide the output amplitudes and timings of sufficient precision, causing problems in its actual use.

SUMMARY OF THE INVENTION

The present invention aims to provide a driver circuit with a temperature correction capability for generating output amplitudes and timings with high stability by detecting the temperature changes in the output elements in the last stage of the driver circuit and compensating the temperature changes in the driver circuit. The temperature correction circuit of the present invention is based on the fact that the heat source in the driver circuit is primarily concentrated on the power consumption by the output elements of the driver circuit.

According to the configuration of the present invention, a driver circuit having a temperature correction circuit includes: a temperature detection means for detecting temperature variations in the output elements 31 and 32 or temperature variations in a driver circuit chip as a whole; an output timing temperature correction means for correcting output timing changes caused by the temperature variations in the output signal 3 relative to the input signal 1 when receiving the temperature detection signal from the temperature detection means; and an output amplitude correction means for correcting output amplitude changes caused by the temperature variations in the output signal 3 when receiving the temperature detection signal from the temperature detection means.

By this arrangement, a temperature correction circuit for a driver circuit that has complementary structured output elements 31 and 32 can be achieved. The driver circuit receives an input signal 1 and generates an output signal 3 of a predetermined output amplitude and output timing. The driver circuit having the temperature correction circuit of the present invention can provide the output signal 3 of the highly stabilized amplitude and timing even though the temperature of the output elements 31 and 32 changes.

One of the examples of the temperature detection means detects electric current in the output elements 31 and 32. Alternatively, the temperature detection means may be a temperature sensor which is provided in close proximity to the output elements 31 and 32. Further, the temperature detection means may be a temperature sensor for detecting the temperature of the driver circuit chip as a whole.

A preferred example of the output timing temperature correction means is a plurality of series connected gate circuits which vary the signal propagation time when receiving the temperature detection signal from the temperature detection means. The positive and negative source voltages for the series connected gates are regulated based on the temperature detection signal, which controls the signal propagation delay time in the series gates for correcting the timings of the output signal.

A preferred example of the output amplitude and output impedance temperature correction means is a buffer circuit which changes the signal amplitude when receiving the temperature detection signal from the temperature detection means. The positive and negative source voltages for the buffer circuit are regulated based on the temperature detection signal, which controls the signal amplitude of the output signal relative to the input signal for correcting the amplitude change caused by the temperature change.

More specifically, the example of configuration of the driver circuit having the temperature correction circuit includes detection resistors 33 and 34 for detecting electric current flowing through the output elements 31 and 32, and electric power monitor circuits H35 and L36 for monitoring the temperature of the output elements 31 and 32 based on the voltages across the detection resistors 33 and 34. The driver circuit further includes correction circuits 37 and 38 for generating correction signals 51, 52, 53 and 54 to be given to a timing adjustment circuit 39 and a bias circuit 40, respectively, when receiving temperature detection signals H22 and L23 from the electric power monitor circuits H35 and L36. The timing adjustment circuit 39 is provided for adjusting the timing of the output signal 3 relative to the input signal 1 when receiving the correction signals 53 and 54 from the correction circuits 37 and 38 to correct the output signal timing changes caused by the temperature changes. The bias circuit 40 is provided for generating the amplitude corrected output signal to the output elements 31 and 32 when receiving the correction signals 51 and 52 from the correction circuits 37 and 38 to establish the output amplitude and impedance temperature correction means.

DETAILED DESCRIPTION OF THE EMBODIMENTS

Figure 1:
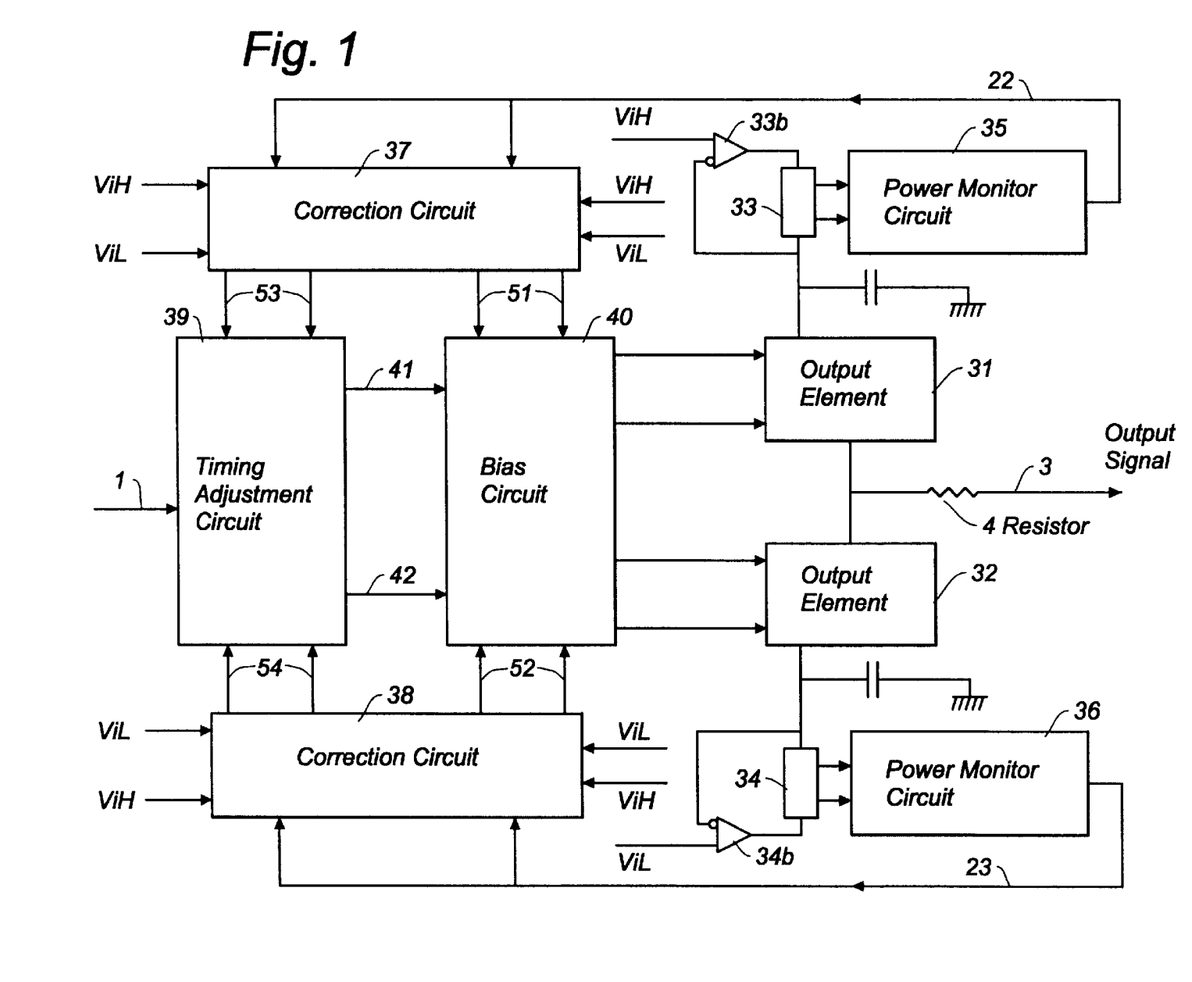
FIG. 1 is a block diagram showing a driver circuit having the temperature correction circuit of the present invention.
Figure 2:
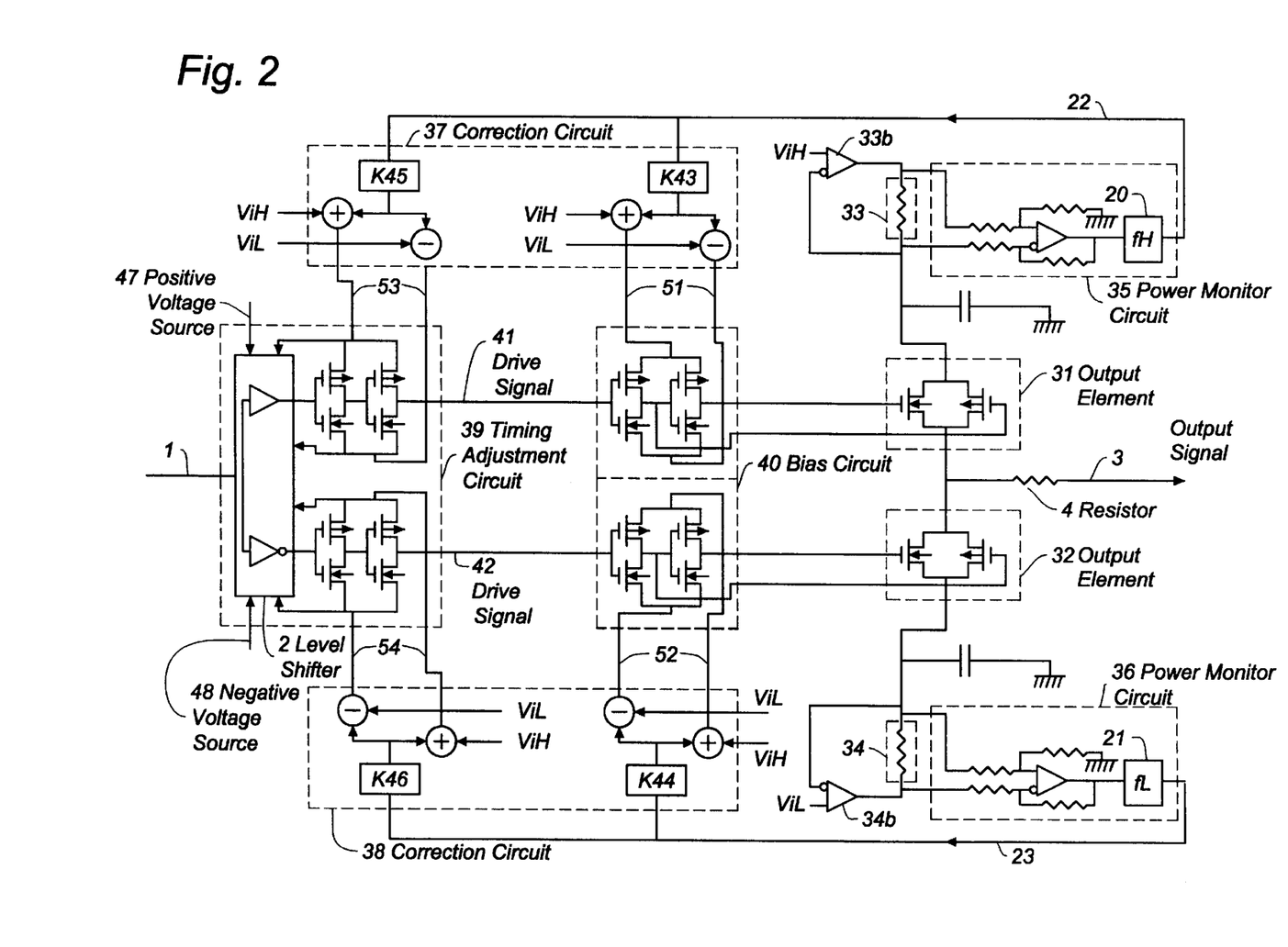
FIG. 2 is a circuit diagram showing a specific example of the driver circuit having the temperature correction circuit of the present invention.

FIG. 1 is a block diagram showing a driver circuit having the temperature correction circuit of the present invention. FIG. 2 is a circuit diagram showing a specific example of the driver circuit having the temperature correction circuit of the present invention. FIG. 3 is a diagram showing an input and output relationship for explaining a principle of temperature correction of the present invention.

Figure 3A:
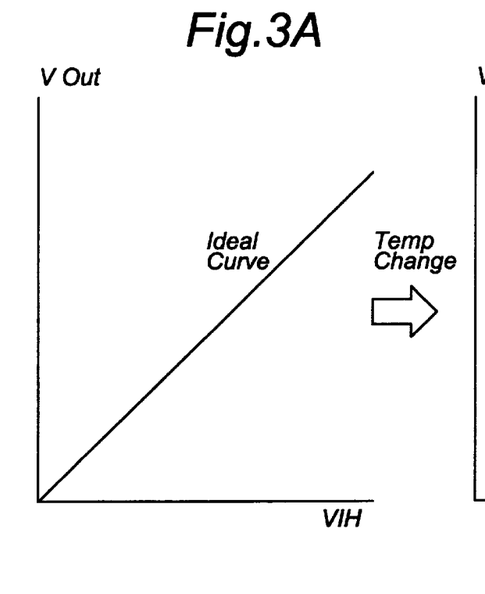
FIGS. 3a–3d is a diagram showing an input and output relationship for explaining a principle of temperature correction of the present invention.
Figure 3B:
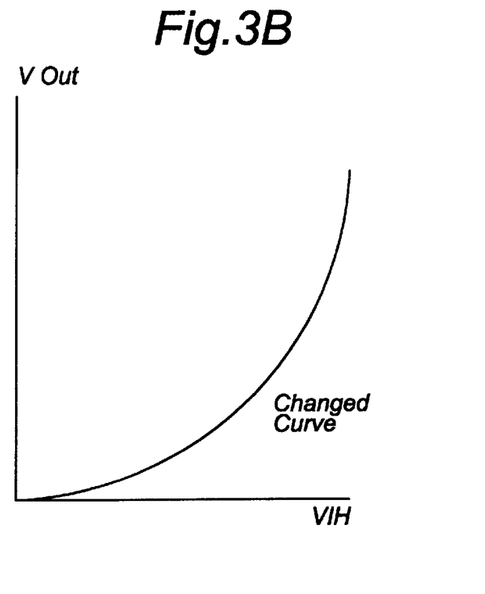
Figure 3C:
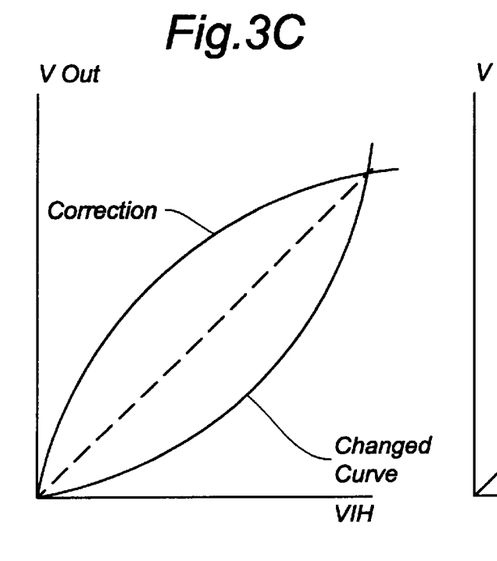
Figure 3D:
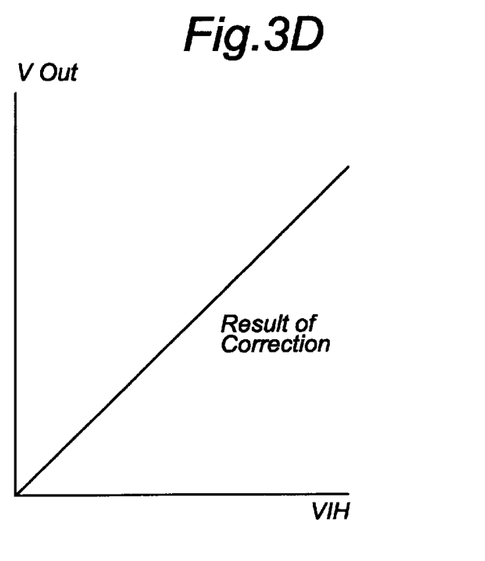

The basic principle of temperature correction is explained with reference to the diagram of FIG. 3 which shows the input/output characteristics with respect to the temperature compensation of the present invention. FIG. 3(A) shows an ideal characteristic required as an output voltage signal wherein the output voltage level is constantly proportional to the input voltage level. FIG. 3(B) shows a situation where the relationship between the input voltage and the output voltage has been non-linearly changed due to the heat dissipated by the junctions of the output elements 31 and 32. In response to this non-linear relationship, the present invention establishes a correction curve of input/output relationship in a correction circuit as shown in FIG. 3(C) which is inverse to the non-linear relationship. Therefore, the output/input voltage relationship is corrected to be almost linear characteristics as shown in FIG. 3(D) to reduce the adverse effects of the temperature change.

The driver circuit having the temperature correction function of the present invention is explained in the following with reference to FIG. 1.

The driver circuit is formed with output elements 31 and 32, electric current detection resistors 33 and 34, differential amplifiers 33b and 34b, electric power monitor circuits H35 and L36, correction circuits 37 and 38, a timing adjustment circuit 39 and a bias circuit 40.

The electric current detection resistors 33 and 34 are resistance to detect electric current flowing through the corresponding output elements 31 and 32. The differential amplifiers 33b and 34b are provided to stabilize the electric voltage supplied to the corresponding voltage source terminals of the output elements 31 and 32.

The electric power monitor circuits H35 and L36 detect voltage drops across the electric current detection resistors 33 and 34, respectively, and provide temperature detection signals H22 and L23 to the correction circuits 37 and 38, respectively.

The correction circuits 37 and 38 receive the temperature detection signals H22 and L23 from the corresponding electric power monitor circuits H35 and L36, and generate correction signals 51, 52, 53 and 54 as voltage sources (ViH, ViL) to be given to the timing adjustment circuit 39 and the bias circuit 40.

The timing adjustment circuit 39 has a variable delay time means therein. When receiving the delay time correction signals 53 and 54 from the correction circuits 37 and 38, respectively, the timing adjustment circuit 39 adjusts delay times of drive signals H41 and L42 to be given to the output elements 31 and 32.

The bias circuit 40 has a variable amplitude means therein. When receiving the amplitude correction signals 51 and 52 from the correction circuits 37 and 38, respectively, the bias circuit 40 provides drive signals having corrected amplitude to the input terminals of the corresponding output elements 31 and 32.

The more detailed example of the driver circuit corresponding to the schematic block diagram of FIG. 1 is shown in FIG. 2.

In this example of circuit configuration, the timing adjustment circuit 39 has a level shifter and a variable delay time means. The variable delay time means in this example has a plurality of series connected gates which receive the correction signals 53 and 54 as voltage sources. By regulating the value of voltage sources to the plurality of gates, the signal propagation delay time between the input signal and the output signal for the plural gates is fine adjusted to establish the variable delay time means. The level shifter 2 is a circuit that shifts an input signal 1 to a predetermined voltage level by generating differential output signals upon receiving the input signal 1.

Integration circuits fH20 and fL21 in the electric power monitor circuits H35 and L36, respectively, integrate periodic voltage signals detected by the current detection resistors 33 and 34 to provide averaged signals to the correction circuits.

Each of the correction circuits 37 and 38 is formed, for example, of a correction coefficient circuit, an adder circuit, and a subtraction circuit. In receiving the temperature detection signals H22 and L23 from the electric power monitor circuits H35 and L36, the correction circuits 37 and 38 provide the correction signals 51, 52, 53 and 54 which work as source voltages (ViH, ViL) to the timing adjustment circuit 39 and the bias circuit 40.

The correction coefficient circuits K43, K44, K45 and K46 in the correction circuits 37 and 38 are to fine adjust the curves when receiving the signals from electric power monitor circuit H35 and L36. The correction coefficient circuits K43–K46 adjust gains and curves of the non-linear characteristics of the output temperature timing and output temperature amplitude of the output elements 31 and 32. Preferably, the correction coefficients are pre-adjusted before being installed in the driver circuit. As an example of achieving the curve adjustment, a non-linear characteristics of the semiconductor device may be used. By the correction coefficient circuits, signals corrected in the gain/curves are provided to the corresponding adder circuits and subtraction circuits. The adder and subtraction circuits supply the voltage sources (ViH, Vil) to the timing adjustment circuit 39 and bias circuit 40 as correction signals after the fine adjustment. Consequently, the timing adjustment circuit 39 carries out the function of fine adjusting the signal propagation delay times in the plurality of gates, and the bias circuit 40 carries out the function of fine adjusting the amplitude of the signals to drive the output elements 31 and 32.

Because of the configuration of the present invention noted above, in response to the temperature changes due to the electric power consumption in the output elements 31 and 32, the resultant changes in the output amplitude and impedance or the change in the output signal timing can be corrected. As a consequence, a driver circuit can be achieved which provides output amplitudes and timings with high precision and stability.

In the embodiment shown in FIG. 2, the driver circuit using CMOS transfer gates is illustrated. However, it is also possible to form the driver circuit with a bipolar circuit accompanied by peripheral circuits suitable for the bipolar circuit.

In the foregoing explanation of the embodiment of the present invention, the temperature changes of the output elements 31 and 32 are detected by the electric power monitor circuits H35 and L36. However, it is also possible to detect the temperature change by other sensors such as a thermostat or a posistor provided close to the output elements 31 and 32. Furthermore, it is possible to include a temperature sensor for detecting the temperature of the IC chip as a whole and the detected result is combined with the detected temperature of the output elements 31 and 32.

The detected signals by the monitor circuits and the temperature sensors are combined and provided to the correction circuits 37 and 38.

In the foregoing explanation of the embodiment, the timing adjustment circuit 39 has the input signal 1 through a single input line. However, it is also possible to establish the timing adjustment circuit 39 in such a way as to receive an input signal through differential input terminals while eliminating the level shifter 2.

In the explanation for the embodiment of the present invention, the temperature correction is achieved with an emphasis on the temperature changes in the output elements 31 and 32. However, it is also possible to achieve the purpose of the present invention by adjusting the correction coefficient circuits K43, K44, K45 and K46 to compensate the overall temperature characteristics of the driver circuit including the timing adjustment circuit 39, the bias circuit 40, the correction circuits 37 and 38, and the electric power monitor circuits H35 and L36.

In the foregoing explanation of the embodiment of the present invention, the electric power monitor circuits H35 and L36 detect the temperature changes in the output elements 31 and 32, or the temperature sensor such as a thermostat and a posistor is provided adjacent to the output devices 31 and 32. However, it is also possible to combine both the electric power monitor circuits and the temperature sensor and a temperature detection signal is produced by adding both detection signals to be provided to the correction circuits 37 and 38.

In the foregoing explanation of the embodiment of the present invention, the electric power monitor circuits H35 and L36 or the temperature sensor such as the thermostat or a posistor is provided to detect the temperature changes in the output elements 31 and 32, and detection signals are provided to the correction circuits 37 and 38, respectively. In other words, in the foregoing examples, two systems of detection signals are feedbacked to the corresponding two systems of correction circuits. However, it is also possible to achieve the object of the present invention by having a single feedback system with one detection signal and one correction circuit for focusing on only one of the output elements 31 and 32. This enables to simplify the circuit configuration of the driver circuit in such a case where either one of the high or low output signals are mainly used.

In the foregoing explanation of the embodiments, the temperature change of the output elements 31 and 32 is detected by electric power monitor circuits H35 and L36 or temperature sensor such as the thermostat and posistor. That is, two types of detection signal are provided. However, it is also possible to use only one type of representative detection signal to be given to the correction circuit. For example, a temperature sensor can be arranged to a sense point that is common to both output elements 31 and 32 to take out a detection signal representative of both output elements. Moreover, the output signal of electric power monitor circuits H35 and L36 can be averaged and used as a representative detection signal. This enables to simplify the circuit configuration of the present invention when the high level and low level circuits in the driver circuit are used in substantially the same manner.

Since it is configured as described in the foregoing, the present invention has the following effects.

Because of correction circuits 37 and 38 and the timing adjustment circuit 39, upon receiving the temperature correction voltage sources from the correction circuits 37 and 38, the timing correction for the temperature change is achieved wherein the signal propagation delay time between the input and output of the plural gates connected in series is fine adjusted. Consequently, the temperature dependency in the output timing of the output signal 3 can be significantly compensated.

Because of the correction circuits 37 and 38, and the bias circuit 40, the signal amplitude correction is achieved wherein the temperature change in the output waveform and the output impedance are corrected. Consequently, the temperature dependency in output signal amplitude can be significantly compensated.

As a result, the fluctuation in the output signal amplitude, the output impedance and the output timing can be corrected in response to the change in the heat dissipation caused by the electric consumption in the output elements 31 and 32. Thus, a driver circuit of precise and stable signal amplitude and precise timing can be realized.

Moreover, unlike the conventional technology, it is possible to obviate the use of a forceful cooler or an air conditioner or cooling system to maintain the temperature surrounding the driver circuit constant.

What is claimed is:

1. A driver circuit having a temperature correction circuit and output elements (31, 32) formed in a complementary structure to receive an input signal (1) and generates an output signal (3) with a predetermined signal amplitude and output timing, said driver circuit comprising:

a temperature detection means directly connected to said output elements (31, 32) for detecting a temperature change in each of the output elements (31, 32) by monitoring a current flowing through each of said output elements (31, 32) which causes a voltage drop across a resistor thereby indicating a power consumption in said driver circuit;

an output timing temperature correction means connected in series with said output elements (31, 32) for correcting temperature changes in output timings in said output signal (3) relative to said input signal (1) upon receiving a temperature detection signal from said temperature detection means which regulates a first source voltage to said output timing temperature correction means; and an output amplitude and impedance temperature correction means connected in series between said output timing temperature correction means and said output elements (31, and 32) for correcting temperature changes in output amplitudes and output impedance of said output signal (3) upon receiving said temperature detection signal from said temperature detection means which regulates a second source voltage to said output amplitude and impedance temperature correction means.

2. A driver circuit having a temperature correction circuit as defined in claim 1 wherein said temperature detection means combines a first detection signal produced based on monitoring said current flowing through said output elements (31, 32) and a second detection signal produced based on temperature detected by a temperature sensor provided adjacent to the output elements (31, 32).

3. A driver circuit having a temperature correction circuit as defined in claim 1 wherein said temperature detection means combines a first detection signal produced based on monitoring said current flowing through said output elements (31, 32) and a second detection signal produced based on temperature detected by a temperature sensor provided adjacent to the output elements (31, 32) and a third detection signal produced based on temperature of an IC chip as a whole having therein said driver circuit.

4. A driver circuit having a temperature correction circuit as defined in claim 1 wherein said output timing temperature correction means corrects said temperature changes in said output timings by receiving said temperature detection signal from said temperature detection means, and controlling positive/negative source voltages of a plurality of gates connected in series in response to said temperature detection signal, thereby regulating signal propagation delay times between input and output signals of said gates.

5. A driver circuit having a temperature correction circuit as defined in claim 1 wherein said output amplitude and impedance temperature correction means corrects said output amplitudes and output impedance by receiving said temperature detection signal from said temperature detection means, and controlling positive/negative source voltages provided to a buffer circuit which transmits said input signal to said output elements (31, 32) in response to said temperature detection signal, thereby regulating said output amplitudes of said output signal.

6. A driver circuit having a temperature correction circuit and output elements (31, 32) formed in a complementary structure to receive an input signal (1) and generates an output signal (3) with a predetermined signal amplitude and output timing, said driver circuit comprising:

a temperature detection means directly connected to said output elements (31, 32) for detecting a temperature change in only one of the output elements (31, 32) by monitoring a current flowing through one of said output elements (31, 32) which causes a voltage drop across a resistor thereby indicating a power consumption in said driver circuit;

an output timing temperature correction means connected in series with said output elements (31, 32) for correcting temperature changes in output timings in said output signal (3) relative to said input signal (1) upon receiving a temperature detection signal from said temperature detection means which regulates a first source voltage to said output timing temperature correction means; and an output amplitude and impedance temperature correction means connected in series between said output timing temperature correction means and said output elements (31, and 32) for correcting temperature changes in output amplitudes and output impedance of said output signal (3) upon receiving said temperature detection signal from said temperature detection means which regulates a second source voltage to said output amplitude and impedance temperature correction means.

7. A driver circuit having a temperature correction circuit and output elements (31, 32) formed in a complementary structure to receive an input signal (1) and generates an output signal (3) with a predetermined signal amplitude and output timing, said temperature correction circuit comprising:

resistors (33, 34) which are series connected to said output elements (31, 32), respectively, for detecting current flowing through said output elements (31, 32);

electric power monitor circuits (H35, L36) for detecting temperature in said output elements (31, 32) by monitoring voltages across said resistors (33, 34) resulted from the current flowing through said output elements (31, 32);

correction circuits (37, 38) that receive temperature detection signals (H22, L23) from said electric power monitor circuits (H35, L36) for generating correction signals (51, 52, 53, 54);

a timing adjustment circuit (39) for correcting output timing changes in said output signal (3) relative to said input signal (1) caused by temperature changes upon receiving said correction signals (53, 54) from said correction circuits (37, 38) which regulate first source voltages for said timing adjustment circuit (39); and a bias circuit (40) connected between said timing adjustment circuit (39) and said output elements (31, 32) for correcting amplitude changes and output impedance changes and providing corrected driver signals to said output elements (31, 32) upon receiving said correction signals (51, 52) from said correction circuits (37, 38) which regulate second source voltages for said bias circuit (40).

* * * * *